United States Patent
Zhang et al.

(10) Patent No.: US 9,601,137 B2
(45) Date of Patent: Mar. 21, 2017

(54) MAGNETIC READ HEAD WITH MAGNETORESISTIVE (MR) ENHANCEMENTS TOWARD LOW RESISTANCE X AREA (RA) PRODUCT

(71) Applicant: Headway Technologies, Inc., Milpitas, CA (US)

(72) Inventors: Kunliang Zhang, Fremont, CA (US); Hui-Chuan Wang, Pleasanton, CA (US); Junjie Quan, Fremont, CA (US); Min Li, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 40 days.

(21) Appl. No.: 14/577,470

(22) Filed: Dec. 19, 2014

(65) Prior Publication Data
US 2016/0180869 A1     Jun. 23, 2016

(51) Int. Cl.
*G11C 11/16* (2006.01)
*G11B 5/39* (2006.01)
(Continued)

(52) U.S. Cl.
CPC ............ *G11B 5/3909* (2013.01); *C23C 14/34* (2013.01); *G01R 33/096* (2013.01); *G01R 33/098* (2013.01); *H01F 10/3254* (2013.01)

(58) Field of Classification Search
CPC .............................. H01L 43/02; G11C 11/161
See application file for complete search history.

(56) References Cited

U.S. PATENT DOCUMENTS 7,888,756 B2 *  2/2011  Mather ............... B82Y 10/00
                                                   257/421
7,897,950 B2    3/2011  Shoji
(Continued)

OTHER PUBLICATIONS

Co-pending US Patent HT13-013, U.S. Appl. No. 14/278,243, filed May 15, 2014, "Reduction of Barrier Resistance X Area (RA) Product and Protection of Perpendicular Magnetic Anistropy (PMA) for Magnetic Device Applications," by Huanlong Liu, et al., 61 pgs.
(Continued)

*Primary Examiner* — Mark Prenty
(74) *Attorney, Agent, or Firm* — Saile Ackerman LLC; Stephen B. Ackerman

(57) ABSTRACT

A method of forming a magnetoresistive (MR) sensor with a composite tunnel barrier comprised primarily of magnesium oxynitride and having a MR ratio of at least 70%, resistance x area (RA) product <1 ohm-$\mu m^2$, and fewer pinholes than a conventional MgO layer is disclosed. The method involves forming a Mg/MgON/Mg, Mg/MgON/MgN, MgN/MgON/MgN, or MgN/MgON/Mg intermediate tunnel barrier stack and then annealing to drive loosely bound oxygen into adjacent layers thereby forming MgO/MgON/Mg, MgO/MgON/MgON, MgON/MgON/MgON, and MgON/MgON/MgO composite tunnel barriers, respectively, wherein oxygen content in the middle MgON layer is greater than in upper and lower MgON layers. The MgON layer in the intermediate tunnel barrier may be formed by a sputtering process followed by a natural oxidation step and has a thickness greater than the Mg and MgN layers.

15 Claims, 6 Drawing Sheets

(51) Int. Cl.
    *C23C 14/34* (2006.01)
    *G01R 33/09* (2006.01)
    *H01F 10/32* (2006.01)

(56) References Cited

U.S. PATENT DOCUMENTS

| | | |
|---|---|---|
| 2007/0047153 A1 | 3/2007 | Zeltser |
| 2008/0102315 A1 | 5/2008 | Fukuzawa et al. |
| 2008/0232002 A1 | 9/2008 | Mather et al. |
| 2014/0087483 A1 | 3/2014 | Ohsawa et al. |
| 2014/0131649 A1 | 5/2014 | Daibou et al. |

OTHER PUBLICATIONS

PCT Search Report, PCT/US2015/056312, Jan. 15, 2016, Headway Technologies, Inc.

* cited by examiner

MAGNETIC READ HEAD WITH MAGNETORESISTIVE (MR) ENHANCEMENTS TOWARD LOW RESISTANCE X AREA (RA) PRODUCT

RELATED PATENT APPLICATION

This application is related to the following: Ser. No. 14/278,243, filed on May 15, 2014; assigned to a common assignee and herein incorporated by reference in its entirety.

TECHNICAL FIELD

The present disclosure relates to a MR sensor element in a read head, and in particular, to a method of forming the tunnel barrier layer in the sensor stack to provide an acceptable magnetoresistive (MR) ratio and low resistance x area (RA) product less than 1 ohm-$\mu m^2$ for enhanced performance and reliability.

BACKGROUND

As the data areal density in hard disk drives (HDD) continuously increases because of technology improvements, the magnetoresistive (MR) sensor that is used as the read-back element in HDD is required to have increasingly better spacial resolution while maintaining a reasonable signal-to-noise ratio (SNR). The sensor is a critical component in which different magnetic states are detected by passing a sense current through the sensor and monitoring a resistance change. A common giant magnetoresistive (GMR) configuration includes two ferromagnetic layers that are separated by a non-magnetic spacer in the sensor stack. One of the ferromagnetic layers is a pinned layer wherein the magnetization direction is fixed by exchange coupling with an adjacent anti-ferromagnetic (AFM) pinning layer. The second ferromagnetic layer is a free layer wherein the magnetization vector can rotate in response to external magnetic fields and is aligned either parallel or anti-parallel to the magnetization in the pinned layer. The spacer may be a conductive metal such as Cu in a giant magnetoresistive (GMR) device, or a dielectric layer in a tunneling magnetoresistive (TMR) sensor.

TMR sensors are commonly employed and provide a higher MR ratio (dR/R) than a GMR sensor where dR is the change in the resistance when a sense current is passed through the sensor, and R is the resistance of the sensor before the change. Advanced devices require a high MR ratio for improved signal-to-noise ratio (SNR) and a low RA product in order to reduce junction noise for better performance. However, it is quite difficult to simultaneously achieve an acceptable MR ratio and a RA product less than 1 ohm-$\mu m^2$ because of the intrinsic physical limit of a MgO tunnel barrier layer. Typically, large interlayer coupling between the free layer and pinned layer, low MR ratio, and short lifetime due to pin holes in the tunnel barrier layer are the three main factors in hindering improvements in read head performance.

In order to meet the needs of current and next generation read head devices, it is necessary to reproducibly form a MR sensor with a MR ratio of 70% or higher and a RA product below 1 ohm-$\mu m^2$. Although much effort has been applied to improving MgO barrier layer quality by depositing smoother films and by increasing film density, the pin hole issue continues to be an obstacle to realizing higher performance and good reliability. Therefore, a better tunnel barrier formation process is needed than currently available in the industry.

SUMMARY

One objective of the present disclosure is to provide a MR sensor element with a dR/R of at least 70% and a RA product <1 ohm-$\mu m^2$.

A second objective of the present disclosure is to provide a method for forming the MR sensor of the first objective wherein the tunnel barrier is fabricated by a method that minimizes or prevents oxidation in the adjoining ferromagnetic layers.

Another objective of the present disclosure is to satisfy the first objective while also lowering the pin hole defects in the tunnel barrier portion of the MR sensor.

According to one embodiment, these objectives are achieved by formation of a MR sensor wherein a stack of layers includes a first or bottom magnetic layer and a second or upper magnetic layer that are separated by a tunnel barrier comprised primarily of MgON. Furthermore, the MgON may be laminated with one or both of MgN and MgO and has an O:N ratio which varies from 50:50 to 99:1. The bottom magnetic layer may be a reference layer in a bottom spin valve configuration, or a free layer in a top spin valve configuration. In some embodiments, one or both of the bottom and top magnetic layers may be part of a synthetic antiferromagnetic (SyAF) multilayer which contains two magnetic layers antiferromagnetically coupled across a non-magnetic layer (typically Ru) through Ruderman-Kittel-Kasuya-Yosida (RKKY) interaction. Preferably, the tunnel barrier layer is fabricated by first depositing a first Mg layer that contacts a top surface of the bottom magnetic layer. Thereafter, one or more MgON layers may be deposited on the first Mg layer by rf sputtering a Mg target in an atmosphere comprised of oxygen and nitrogen gas, or by rf sputtering a MgON target in inert gas. The rf sputtering is performed at low power to prevent degradation of the Mg layer so that oxygen is not introduced into the lower magnetic layer. A second Mg layer or a MgN layer may be deposited on the MgON layer to give an intermediate tunnel barrier stack with a Mg/MgO$_y$N$_z$/Mg configuration, where y is the oxygen content and z is the nitrogen content in the magnesium oxynitride layer.

Thereafter, the sensor stack is completed by depositing the top magnetic layer on the intermediate tunnel barrier stack and then depositing one or more overlying layers such as a capping layer. Next, an anneal process is used to promote a high TMR ratio and transform the intermediate tunnel barrier stack into the final tunnel barrier structure. Depending on annealing conditions and the thickness of the first Mg layer, oxygen in the MgON layer of the tunnel barrier may diffuse into the first Mg layer to form a lower MgO layer that interfaces with the bottom magnetic layer, and diffuses into the second Mg layer to give an upper MgO layer which interfaces with the top magnetic layer for a final MgO/MgO$_{y1}$N$_{z1}$/MgO tunnel barrier structure where oxygen content y1 is less than y.

In alternative embodiments, the intermediate tunnel barrier layer has a Mg/MgO$_y$N$_z$/MgN, MgN/MgO$_y$N$_z$/MgN, or MgN/MgO$_y$N$_z$/Mg configuration and is converted to a MgO/MgO$_{y1}$N$_{z1}$/MgO$_{y2}$N$_{z2}$, MgO$_{y3}$N$_{z3}$/MgO$_{y1}$N$_{z1}$/MgO$_{y2}$N$_{z2}$, or MgO$_{y3}$N$_{z3}$/MgO$_{y1}$N$_{z1}$/MgO final tunnel barrier structure, respectively, after an annealing process causes oxygen diffusion from the middle MgO$_y$N$_z$ layer into the adjoining Mg and MgN layers.

In all embodiments, the Mg and MgN layers adjoining the middle $MgO_yN_z$ layer in the intermediate tunnel barrier advantageously serve as a buffer to limit the amount of oxygen reaching the bottom magnetic layer and upper magnetic layer, respectively, during the anneal process so that undesired oxidation and degradation in MR ratio is avoided. Since MgON has a lower band gap than MgO, a lattice similar to MgO, and the final tunnel barrier comprises primarily magnesium oxynitride, a high MR ratio can be realized simultaneously with a low RA product as well as reduced pin hole density compared with a MgO tunnel barrier.

The present disclosure also anticipates a dual spin valve design having a reference layer 1/tunnel barrier 1/free layer/tunnel barrier 2/reference layer 2 stack or a free layer 1/tunnel barrier 1/reference layer/tunnel barrier 2/free layer 2 stack where both tunnel barriers are made by a process as described herein and have a composite structure according to one of the embodiments described herein.

DETAILED DESCRIPTION

The present disclosure is a method of forming a high performance MR sensor in a read head that may be part of a combined read head/write head structure used in a thermally assisted magnetic recording (TAMR) device. The MR sensor as defined herein may also serve as a magnetic tunnel junction (MTJ) in a magnetic random access memory (MRAM) device. In all drawings, the x-axis corresponds to the cross-track direction, the z-axis is the down-track direction, and the y-axis is aligned perpendicular to an air bearing surface (ABS) and extends towards a back end of the device.

Figure 1:
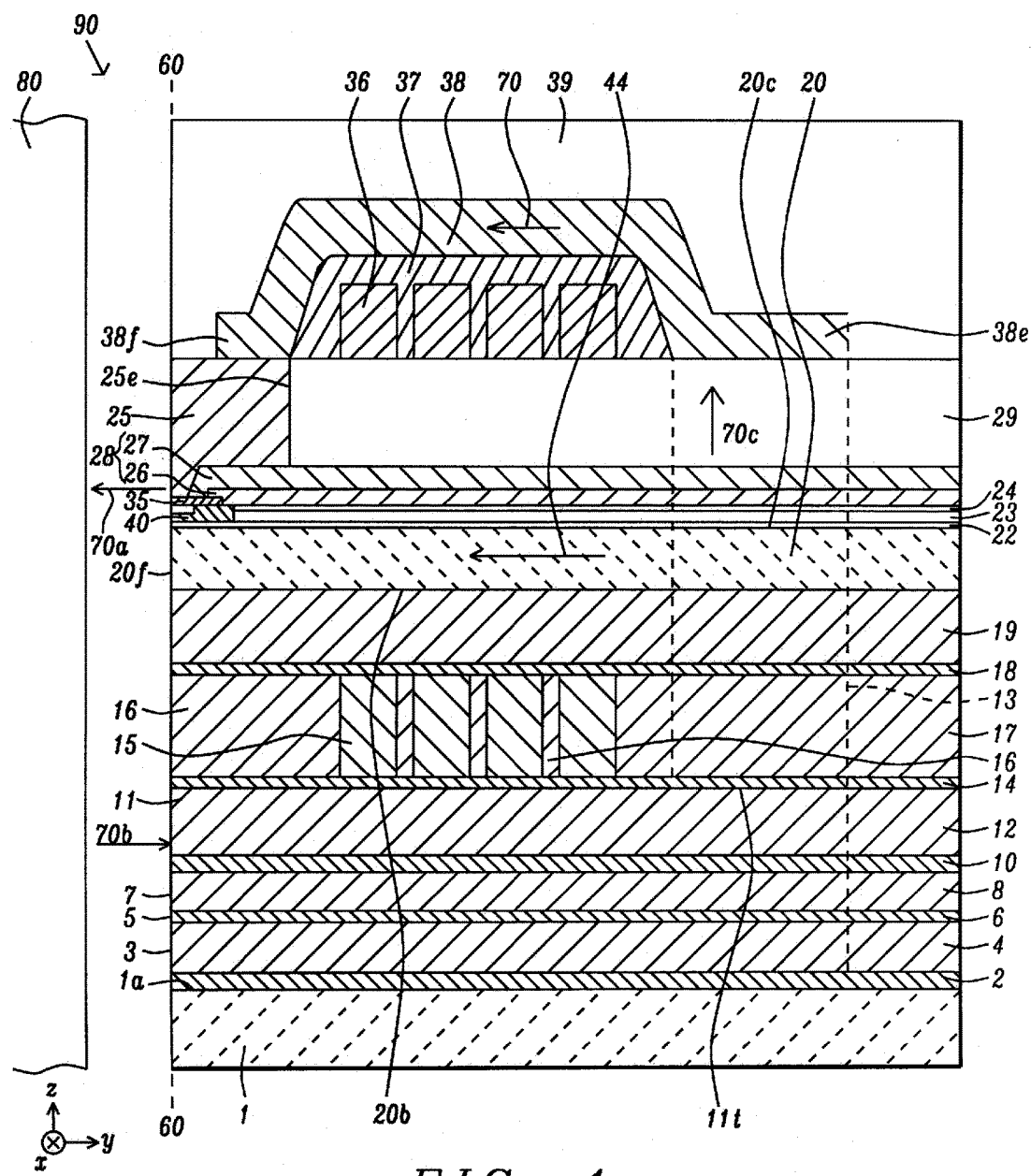
FIG. 1 is a down-track cross-sectional view showing a combined read head/write head according to one embodiment of the present disclosure.

In FIG. 1, a TAMR head 90 according to one embodiment of the present disclosure is illustrated. The TAMR head flies over a magnetic medium 80 in a z-axis direction during a write or read process, and has an air bearing surface (ABS) 60-60 facing the magnetic medium. A MR sensor 5 is incorporated in a read head portion of the TAMR device as described below. It should be understood that the MR sensor is compatible with other read head designs and that FIG. 1 is included for illustrative purposes only and not necessarily as the preferred embodiment. Moreover, other write head configurations may be used with the read head design as described herein without sacrificing any advantages of the present disclosure.

The bottommost layer in the TAMR head is a substrate 1 that is typically alumina-TiC (AlTiC). Above the substrate are sequentially formed an insulation layer 2, bottom (S1) shield 3, insulation layer 6, and top (S2) shield 7. Insulation layer 4 surrounds the bottom shield and insulation layer 8 surrounds the top shield. The insulation layers may be comprised of alumina or another dielectric material. A magnetoresistive (MR) sensor 5 is formed at the ABS and within insulation layer 6. The MR sensor typically includes two ferromagnetic (FM) layers separated by a non-magnetic spacer (not shown) wherein a first FM layer has a fixed magnetization direction, and the second FM layer has a magnetization that rotates between a parallel and anti-parallel direction with respect to the fixed magnetization when influenced by an external magnetic field. The MR sensor has one of two resistance values when a sense current is applied in a current perpendicular to plane (CPP) direction, depending on the magnetization direction of the second FM (free) layer. In the present disclosure, the non-magnetic spacer is preferably a tunnel barrier layer made substantially of MgON that may be laminated with one or more MgO or MgN layers. Layers 2-8 represent a read head component of the TAMR head.

The TAMR head further comprises a write head portion including non-magnetic layer 10, return pole 11, and insulation layer 14 that are sequentially formed on the top shield 7. The return pole is surrounded by insulation layer 12. There is a magnetic coupling layer 13 proximate to a back end of the TAMR head that extends upward in a z-axis direction from a top surface 11t of the return pole to a yoke 38 that in turn connects to a portion of top surface on magnetic pole layer 25 hereafter called the main pole that is proximate to the ABS 60-60. A coil 15 made of a conductive material such as Cu, and comprised of a plurality of turns (four are pictured) that are in a spiral shape from a top-down view (not shown) is disposed on a top surface of insulation layer 14 between the magnetic coupling layer 13 and the ABS. An insulation layer 16 such as a photoresist is formed between adjacent turns of the coil, and between the coil and ABS while another insulation layer 17 surrounds the coil. Yet another insulation layer 18 is formed on the top surfaces of the coil 15, insulation layer 16, and insulation layer 17. Bottom portions of magnetic coupling layer 13 are embedded in insulating layers 14, 17.

Above insulation layer 18 are successively formed a cladding layer 19, waveguide 20, and cladding layer 22. Another cladding layer 21 (FIG. 2a) surrounds the waveguide. Cladding layers have a refractive index lower than that of the waveguide and may comprise silicon oxide, alumina, silicon oxynitride, silicon nitride, or $MgF_2$. The waveguide may be tantalum oxide ($Ta_2O_5$), for example. The waveguide has an end 20a at the ABS, a bottom surface 20b, and a top surface 20c for transmitting evanescent light. A light source (not shown) such as a laser is affixed to a back end of substrate 1 and generates light 44 which is directed into the waveguide and transmitted toward the ABS 60-60.

Figure 4:
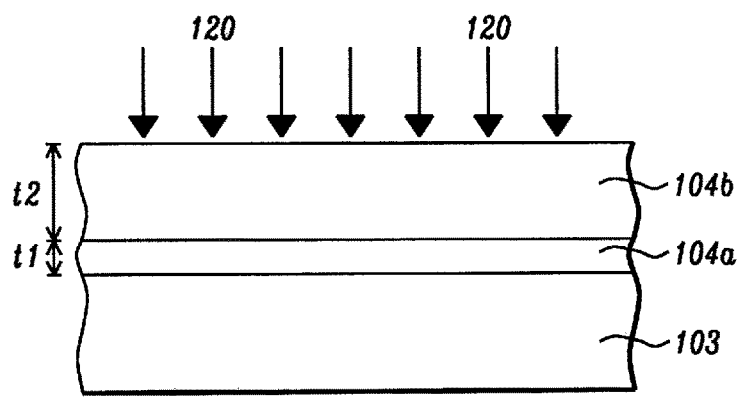
FIGS. 4-7 illustrate a sequence of steps for forming a MgO/MgON/MgO tunnel barrier layer according to an embodiment of the present disclosure.

A portion of the light is coupled to an overlying planar plasmon generator (PPG) 40 where it excites a plasmon mode. The plasmon energy mode 44p shown in FIG. 4b propagates to the ABS and emerges from the PPG to heat a localized spot on magnetic medium 80 and thereby enable a lower magnetic field from the main pole to write data during a write process. PPG 40 is adjoined on the sides thereof including the back side facing away from the ABS by a stack of dielectric layers 23, 24 that may be comprised of the same material as in cladding layers 19, 21, 22. Dielectric layer 24 also forms a gap between a top surface of a front portion (peg) of PPG 40 and an overlying barrier layer 35 at the ABS 60-60. The barrier layer extends from the ABS toward a back end of the TAMR head and covers a front section of top surface on a PPG back portion where the PPG top surface is coplanar with a top surface of dielectric layer 24. The barrier layer is one of Zr, Pd, Cu, Ni, Fe, Co, Ta, TaOx, $SiO_2$, $Al_2O_3$, TaOx, and SiON, and is advantageously used as an etch stop layer during the fabrication of composite heat sink 28.

According to one embodiment, there is a composite heat sink 28 with a first layer 26 made of a noble metal such as Au or Ag, and a second layer 27 that is one of Ru, Zr, Pd, Cu, Ni, Fe, Co, or Ta. First heat sink layer 26 is useful for having a high thermal conductivity property in order to efficiently disperse heat that is generated by the plasmon mode away from the PPG 40 thereby improving thermal stability therein. Second heat sink layer 27 serves as a barrier between the first heat sink layer and main pole 25 in order to prevent Au or Ag diffusion into the magnetic material and subsequent degradation of writing capability. The main pole, yoke 38, and magnetic coupling layer 13 may be formed of a magnetic alloy such as CoFe, CoFeNi, or NiFe.

The TAMR head further includes an insulation layer 29 formed on a top surface of heat sink layer 27 and extending from a back side of main pole 25 toward a back end of the device. Insulation layer 29 preferably has a top surface that is coplanar with a top surface of the main pole and of the magnetic coupling layer 13. A coil 36 with a plurality of turns is formed on insulation layer 29 wherein adjacent turns are separated by a dielectric layer 37 that is typically a photoresist layer. The yoke 38 overlays on dielectric layer 37, and a front portion 38f thereof is recessed from the ABS 60-60 and contacts a top surface of the main pole while a back end portion 38e adjoins the top surface of the magnetic coupling layer. As a result, a magnetic flux pathway is formed whereby flux 70 is generated by coil 36, exits the TAMR head as magnetic field 70a that writes data onto a magnetic bit (not shown) in magnetic medium 80, returns as flux 70b in return pole 11, and cycles back to the yoke through the magnetic coupling layer as flux 70c. As an uppermost layer in the TAMR head, a protective layer 39 made of alumina, for example, is formed on a front section of main pole, on yoke 38, and on a back section of insulation layer 29.

Figure 2:
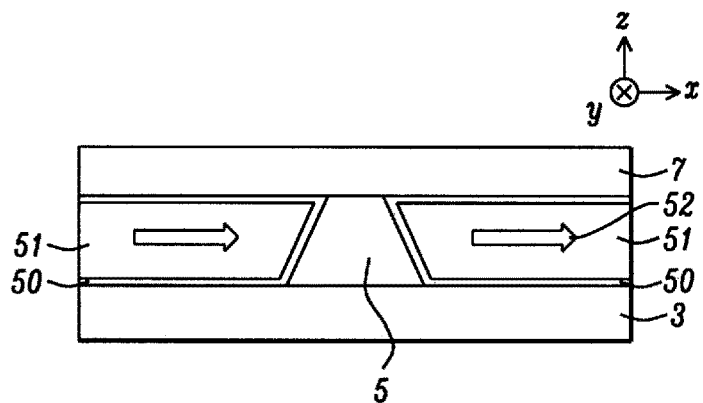
FIG. 2 is an ABS cross-sectional view depicting a portion of a read head in FIG. 1 wherein a MR sensor is formed between top and bottom shields.

Referring to FIG. 2, a portion of the read head in FIG. 1 is shown from an ABS view wherein the sensor element 5 is formed between top shield 7 and bottom shield 3, and between hard bias structures 51 that are positioned on opposite sides of the sensor. The hard bias structures having a longitudinal magnetization 52 provide a biasing magnetic field on the sides of the sensor to orientate the free layer magnetization 110 (FIG. 3) in the in-plane direction. Materials suitable to form a hard bias layer include CoPt, CoCrPt, FePt, NiFe, and the like. There is an insulation layer 50 made of alumina or silicon oxide, for example, to separate the sensor from hard bias structures.

Figure 3:
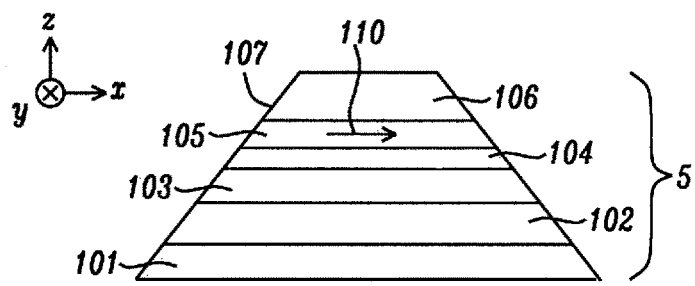
FIG. 3 is an ABS cross-sectional view showing a stack of layers in the MR sensor according to one embodiment of the present disclosure.

In FIG. 3, the sensor element 5 is shown with a bottom spin valve configuration that typically has a seed layer 101, AFM layer 102, pinned layer 103, tunnel barrier layer 104, free layer 105 having a magnetization direction 110, and a capping layer 106 that are sequentially formed on the bottom shield (not shown). One or both of the pinned layer and free layer may have a synthetic antiferromagnetic (SyAF) configuration wherein a first ferromagnetic (FM1) layer is antiferromagnetically coupled to a second ferromagnetic (FM2) layer through an intermediate coupling layer. For example, pinned layer 103 may have a FM1/Ru/FM2 configuration where the FM1 layer contacts the seed layer, the FM2 layer contacts the tunnel barrier layer, and Ru is the coupling layer.

Seed layer 101 may be comprised of one or more of Ta, Ru, Ti, Cu, TaN, NiCr, NiFeCr, CrTi, or may be other seed layer materials used in the art. AFM layer 102 may be one of MnPt, IrMn, NiMn, OsMn, RuMn, RhMn, PdMn, RuRhMn, or MnPtPd. In one embodiment, pinned layer 103 is preferably Co, Fe, CoFe, or alloys thereof and may include one or more additional elements such as B and Ni. In a SyAF configuration, both FM1 and FM2 layers in the pinned layer may be Co, Fe, or alloys thereof. In other embodiments, the pinned layer may be comprised of a laminated stack $(A1/A2)_n$ where A1 is Co or an alloy thereof, A2 is Ni or an alloy thereof, and n is a lamination number $\geq 1$. When a laminated stack $(A1/A2)_n$ is used for the pinned layer or as a FM2 layer in a SyAF configuration, a transition layer (not shown) such as Co, CoFe/Co, or CoFeB/Co may be deposited on an uppermost A2 layer to improve the lattice transition between the pinned layer and the tunnel barrier layer 104. In a SyAF pinned layer scheme, the coupling layer is preferably Ru but may be other materials such as Rh or Ir that enable efficient antiferromagnetic coupling between the FM1 and FM2 layers. The pinned layer may have in-plane magnetization or perpendicular magnetic anisotropy (PMA).

A key feature of the present disclosure is the tunnel barrier layer 104 that is made primarily of magnesium oxynitride wherein the oxygen/nitrogen ratio is from 50:50 to 99:1. As described later, the process for fabricating the tunnel barrier minimizes pin hole density and enables a RA product less than 1 ohm-$\mu m^2$ with a MR ratio of at least 70%. In particular, an intermediate tunnel barrier layer with a Mg/MgO$_y$N$_z$, Mg/MgO$_y$N$_z$/MgN, MgN/MgO$_y$N$_z$/MgN, or MgN/MgO$_y$N$_z$/Mg configuration is annealed and thereby converted to a MgO/MgO$_{y1}$N$_{z1}$/MgO, MgO/MgO$_{y1}$N$_{z1}$/MgO$_{y2}$N$_{z2}$, MgO$_{y3}$N$_{z3}$/MgO$_{y1}$N$_{z1}$/MgO$_{y2}$N$_{z2}$, or MgO$_{y3}$N$_{z3}$/MgO$_{y1}$N$_{z1}$/MgO final tunnel barrier structure, respectively, where oxygen content y1<oxygen content y. Moreover, oxygen content y2 and y3 may be less than y1.

Above the tunnel barrier layer is free layer 105 that may be a single magnetic layer or a composite with a plurality of magnetic layers having either in-plane or PMA with similar composition to the pinned layer. In other embodiments, a non-magnetic insertion layer such as Ta may be formed between two magnetic layers in the free layer stack. Each of the one or more magnetic layers in the free layer may be comprised of one or more of Co, Fe, Ni, and in some embodiments may include a non-magnetic amorphous element such as B, Zr, Hf, or Nb. In general, the free layer composition is selected to maximize the (dR/R) ratio. A higher MR ratio (dR/R) means a faster readout of the MR sensor's magnetic state. Magnetic layers with PMA may be employed to increase the thermal stability of the free layer thereby decreasing the likelihood of unintended magnetization switching.

In one aspect, capping layer 106 is comprised of one or more metal layers including Ta, and Ru although other non-magnetic layers used in the art are acceptable. In an alternative embodiment, the capping layer may be a metal oxide such as MgO, TiOx, HfOx, or $Al_2O_3$, or laminates of one or more of the aforementioned metal oxides. Moreover, the metal oxide may be doped with a metal to improve conductivity therein. Preferably, the capping layer contacts the top shield 7 to provide an electrical connection for a sense current (not shown) to flow between the top shield and bottom shield during a read operation.

As magnetic devices require higher areal density, MR sensors and MTJ elements tend to become smaller with shrinking in-plane dimensions and thicknesses for layers including the pinned layer, tunnel barrier, and free layer. Control of the tunnel barrier formation process is especially critical in order to generate a uniform tunnel barrier with low RA and low pin hole defects. In the prior art, formation of MgO and other metal oxides as a tunnel barrier has been accomplished with a single oxidation of a Mg (metal) layer, or with multiple oxidation steps applied in a sequential manner to a plurality of Mg or metal layers, or by sputter deposition of a metal oxide (MgO) layer. However, prior art MgO fabrication is not compatible with next generation MTJ devices where the magnetic layers at top and bottom surfaces of the tunnel barrier preferably have PMA in order to promote higher thermal stability while maintaining a high TMR ratio. In particular, a higher degree of control must be incorporated in the tunnel barrier fabrication process to avoid or minimize oxygen incursion into the adjoining magnetic layers. Furthermore, we have found that replacing all of part of a MgO tunnel barrier with MgON that has a lower band gap value and similar lattice constant is beneficial in significantly decreasing pin hole defects while satisfying MR ratio and RA product objectives mentioned previously.

In the exemplary embodiments, Mg is used as the metal for tunnel barrier fabrication. However, one or more other metals or alloys including Al, Ta, Zn, Ti, AlZn, AlTi, CoMg, ZnMg, and Sn, may be selected instead of Mg. For example, the first (lower) metal layer and upper metal layer that are oxidized in an intermediate tunnel barrier stack may be comprised of a first metal or alloy while one or more intermediate metal oxynitride layers may be formed from a second metal or alloy unequal to the first metal or alloy. However, for the purpose of improving throughput, all metal oxide and metal oxynitride layers in the final tunnel barrier configuration are preferably formed from the same metal or alloy. In some embodiments, a metal oxide/metal oxynitride/metal oxide composite tunnel barrier is formed wherein the composite tunnel barrier is comprised primarily of metal oxynitride and an oxygen content in the metal oxide layers is less than that in the metal oxynitride layer. In other embodiments, a metal oxide/first metal oxynitride/second metal oxynitride or third metal oxynitride/first metal oxynitride/metal oxide tunnel barrier is formed wherein the composite tunnel barrier is comprised primarily of metal oxynitride layers and an oxygen content in the second and third metal oxynitride layers may be less than the oxygen content in the first metal oxynitride layer. In yet another embodiment, a metal oxynitride/metal oxynitride/metal oxynitride stack is formed wherein the upper and lower metal oxynitride layers may have a lower oxygen content than in the middle metal oxynitride layer.

According to one embodiment of the present disclosure, the process flow for fabricating a tunnel barrier layer 104 is depicted in FIGS. 4-7. In an initial step shown in FIG. 4, a first Mg layer 104a is sputter deposited on pinned layer 103 and has a thickness t1 that is preferably 1-3 Angstroms to ensure a continuous film with no pinholes. A Mg film with a thickness less than 1 Angstrom is likely to be discontinuous and comprise gaps between adjacent grains that extend vertically through the entire layer 104a. Note that a seed layer and AFM layer are successively formed on a bottom shield below the pinned layer but are not shown in FIGS. 4-5. Thereafter, a $MgO_yN_z$ layer 104b is sputter deposited 120 to a thickness t2 of 4 to 8 Angstroms that is substantially larger than t1. The sputter deposition process may comprise sputtering a Mg target in an atmosphere of $O_2$ and $N_2$, or sputtering a MgON target in inert gas such as Ar.

It is important to minimize the power applied during the MgON deposition process to prevent the possibility of oxygen penetration through the first Mg layer and into the pinned layer 103. According a preferred embodiment, the MgON deposition on layer 104a in a sputter chamber comprises a Mg target, an Ar gas flow of 5 to 150 standard cubic centimeters per minute (sccm), an $O_2$ flow rate of 0.05 to 2 sccm, a $N_2$ flow rate between 0.5 and 5 sccm, a rf power of about 50 W to 400 W, a negative bias voltage of about −20 V to −100 V applied to the substrate, and a duty cycle from 20% to 70%. The sputtering process may take place with a sputtering chamber temperature in the range of 25° C. to 350° C. The resulting MgON layer has a composition represented by $MgO_yN_z$ where y and z are the atomic %, respectively, of oxygen and nitrogen, and the ratio y:z is preferably from 50:50 to 99:1.

In an alternative embodiment, MgON deposition comprises rf sputtering a MgON target with an Ar gas flow and a sputter chamber temperature from 25° C. to 350° C. The present disclosure also anticipates that following the rf sputter deposition of a MgON film, formation of a $MgO_yN_z$ film 104b may further comprise a second step wherein only oxygen flow is maintained in the sputter chamber for a period of 10 seconds to 5 minutes after the first step of rf sputter deposition is completed. In other words, no rf power is involved and the second step is effectively a natural oxidation process. As a result of the second step, it is believed that the concentration of loosely bound oxygen is increased in the sputter deposited $MgO_yN_z$ film, and the magnesium oxynitride film may become more oxidized. In one aspect, total oxygen content may be considered a combination of covalently bound oxygen to Mg atoms, and oxygen molecules that are held within the MgON matrix by van der Waals forces but are not covalently bound.

Following the layer 104b formation process, either by a one step or two step method, it is believed that there is a certain volume of loosely (non-covalent) bound oxygen in the deposited $MgO_yN_z$ film which is absorbed from the oxygen containing atmosphere in the sputter deposition chamber. A key concept is that the loosely bound oxygen migrates into adjacent layers during a subsequent anneal process wherein elevated temperatures up to 350° C. (or up to 450° C. for a MTJ in a MRAM device) are employed and provide energy to overcome non-covalent attractions that generally keep oxygen molecules within the MgON layer at room temperature.

In other embodiments, upper layer 104b in the intermediate tunnel barrier stack 104a/104b may further comprise one or more of MgN and MgO that are formed by a sputter deposition process. However, thickness t2 must be controlled to provide a RA product <1 ohm-$\mu m^2$ in the final tunnel barrier layer.

Figure 5:
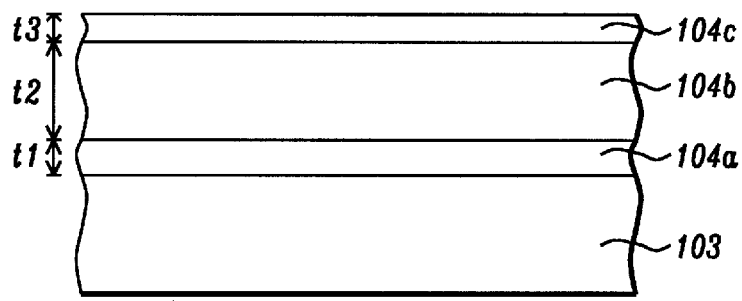

Referring to FIG. 5, a second Mg layer 104c may be sputter deposited on a top surface of layer 104b to give an intermediate tunnel barrier stack with a 104a/104b/104c configuration. Preferably, thickness t3 of the second Mg layer is less than t2 such that the final tunnel barrier layer will be comprised primarily of magnesium oxynitride. In some embodiments, t3 may be about 1 to 3 Angstroms. A maximum thickness for t3 is determined in part by the temperature and time involved in a subsequent annealing step. In particular, t3 should not be so large that oxygen from layer 104b does not diffuse into all portions of second Mg layer 104c and fail to oxidize a portion thereof during the annealing step. Especially when free layer 105 has PMA, it is important that a metal oxide/free layer interface be formed in order to maximize PMA in the free layer. Optionally, an anneal process may be employed during deposition of the second metal layer 104c such that the second metal layer is partially or totally converted to a metal oxide before the free layer is deposited.

Figure 6:
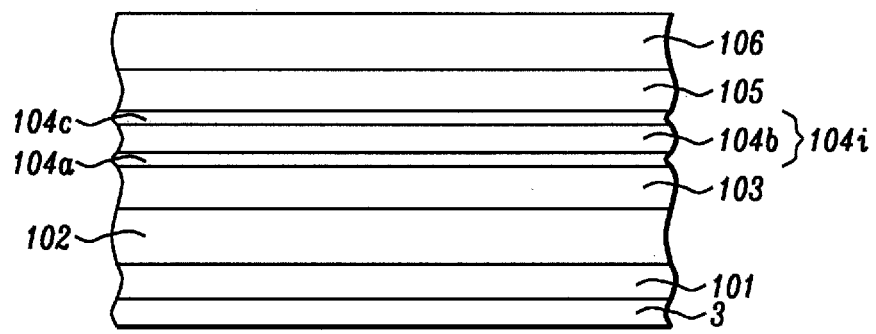

As depicted in FIG. 6, free layer 105 and capping layer 106 may be sequentially formed on the second Mg layer. At this point, all layers in the MR sensor stack have been deposited although tunnel barrier 104i still has an intermediate configuration that will be converted to a final structure in a subsequent annealing step.

Figure 7:
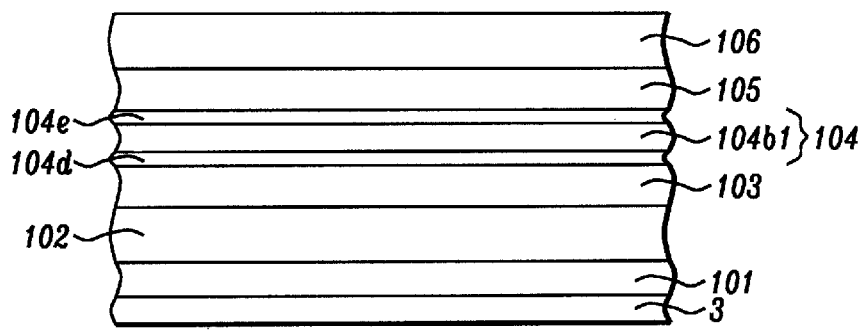

Referring to FIG. 7, the MR sensor stack in a read head is subjected to an anneal step comprising a thermal treatment between 200° C. and 350° C. for a period of 5 minutes to 5 hours after the capping layer is formed. When the MR sensor is a MTJ element in a MRAM device, annealing temperature may be increased up to 400° C. to 450° C. Because of oxygen diffusion from $MgO_yN_z$ layer 104b, Mg layers 104a, 104c are converted to MgO layers 104d, 104e, respectively, and transform intermediate stack 104i into a final tunnel barrier structure 104. Also, MgON layer 104b is transformed to MgON layer 104b1 wherein there is a reduction in oxygen content from y in layer 104b to y1 in layer 104b1 that has a $MgO_{y1}N_{z1}$ composition. Temperature and process time are advantageously used to control oxygen diffusion length to regulate the degree of oxidation in layers 104a, 104c without substantial oxidation of the adjoining pinned layer and free layer. Since a Mg lattice contracts when oxidized, the thicknesses of layers 104d, 104e are believed to be less than t1, t3, respectively, and remain substantially less than a thickness of the middle $MgO_{y1}N_{z1}$ layer in the composite tunnel barrier with a 104d/104b1/104e stack of layers. Furthermore, there may be an oxygen gradient in metal oxide layers 104d, 104e such that oxygen content decreases with increasing distance from the middle $MgO_{y1}N_{z1}$ layer. The thickness of the middle $MgO_{y1}N_{z1}$ layer is expected to remain about 4 to 8 Angstroms in embodiments where oxygen diffusion from the $MgO_yN_z$ layer is substantially from loosely bound oxygen that does not cause a change in MgO lattice size.

It should be understood that a relatively thick first or second Mg layer where t1 and t3≥3 Angstroms will provide a substantial contribution to the final RA value. Therefore, t1 and t3 are preferably maintained between 1 to 3 Angstroms to achieve a RA product <1 ohm-$\mu m^2$. Preferably, unoxidized Mg layers 104a, 104c (or MgN layers in other embodiments) are present on top and bottom surfaces of layer 104b during processes related to formation of a top magnetic (free) layer and overlying layers such as a capping layer so that oxygen does not penetrate and oxidize a portion of layers 103, 105. Thus, first and second metal (Mg) layers in the intermediate tunnel barrier stack 104i prevent oxidation of adjoining magnetic layers during fabrication of the MR sensor stack, but become oxidized during a subsequent anneal step so that a metal oxide/magnetic layer interface is established at the boundary of tunnel barrier 104 with layers 103, 105.

Figure 8:
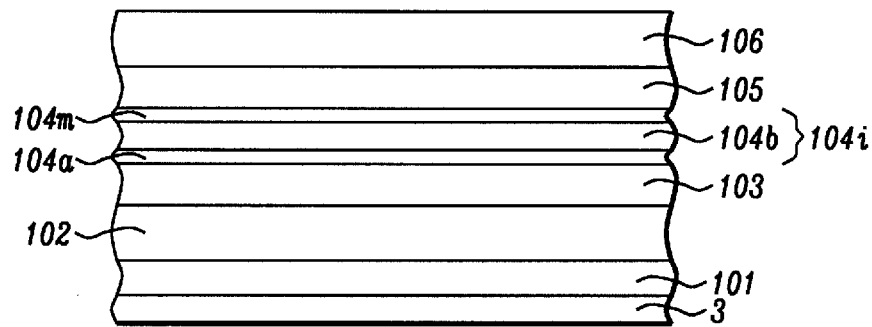
FIGS. 8-9 illustrate a sequence of steps for forming a $MgO/MgO_{y1}N_{z1}/MgO_{y2}N_{z2}$ tunnel barrier layer according to another embodiment of the present disclosure.

In an alternative embodiment depicted in FIG. 8, the second Mg layer is omitted and the intermediate tunnel barrier 104i consists of first Mg layer 104a and an overlying stack 104b/104m comprised primarily of MgON. In one aspect, both layers 104b, 104m may be MgON. However, the 104b/104m stack may have a MgON/MgN configuration wherein a lower MgON layer 104b contacts the first Mg layer and an upper MgN layer 104m is advantageously employed to prevent oxygen diffusion into an adjacent free layer 105 during a subsequent anneal step. The upper MgN layer may have a thickness from 1 to 3 Angstroms.

Figure 9:
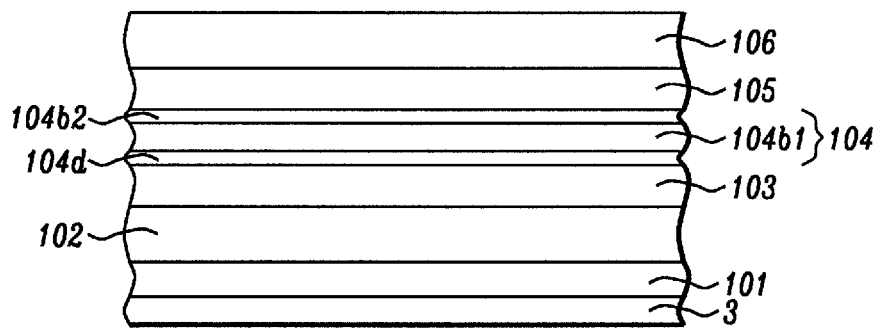

Referring to FIG. 9, the MR sensor stack is shown after an annealing step described earlier is performed wherein intermediate tunnel barrier 104i is transformed into a final tunnel barrier structure 104. In an example where the upper layer has a MgON/MgN configuration, oxygen from layer 104b diffuses into the MgN layer to form a final tunnel barrier having a $MgO/MgO_{y1}N_{z1}/MgO_{y2}N_{z2}$ configuration represented by 104d/104b1/104b2 wherein the oxygen and nitrogen content in layer 104b1 contacting the MgO layer may have a different oxygen and nitrogen content than in the upper layer 104b2 that contacts the free layer 105. Preferably, MgN layer 104m is converted to layer 104b2 without significant oxygen diffusion into the free layer, and the thicknesses of layers 104d, 104b2 are each less than that of the $MgO_{y1}N_{z1}$ layer. In one aspect, the upper $MgO_{y2}N_{z2}$ layer has a lower oxygen content than the middle $MgO_{y1}N_{z1}$ layer. Thus, the final tunnel barrier structure is comprised primarily of magnesium oxynitride.

In an alternative embodiment relating to a top spin valve configuration in FIG. 10, the pinned layer 103 becomes the top magnetic layer while the free layer 105 is the bottom magnetic layer below the tunnel barrier stack 104. All other features including a method of forming the tunnel barrier layer are retained from the previously described embodiment shown in FIG. 7. Moreover, the AFM layer 102 is moved from contacting the seed layer 101 to a position between the pinned layer and capping layer 106.

Figure 11:
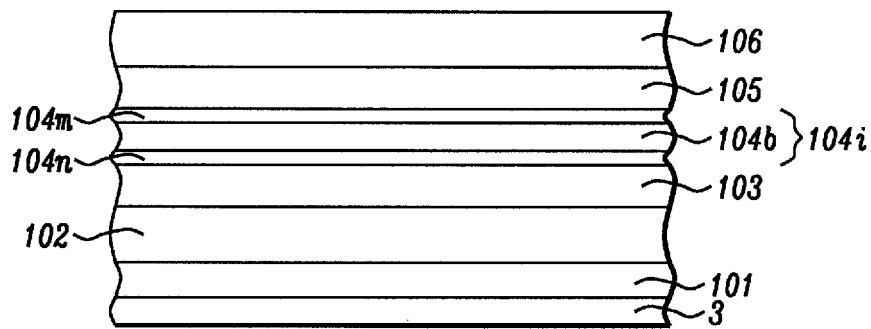
FIGS. 11-12 illustrate a sequence of steps for forming a $MgO_{y3}N_{z3}/MgO_{y1}N_{z1}/MgO_{y2}N_{z2}$ tunnel barrier layer according to another embodiment of the present disclosure.

Referring to FIG. 11, the present disclosure also encompasses another embodiment wherein the first Mg layer in the previous embodiments is replaced by a MgN layer. For example, the first Mg layer 104a in FIG. 8 may be replaced by a MgN layer 104n to yield an intermediate tunnel barrier stack 104i having a MgN/MgON/MgN configuration where MgON layer 104b is sandwiched between two MgN layers 104n, 104m. Similar to the upper MgN layer described previously, the lower MgN layer may have a thickness from 1 to 3 Angstroms.

Figure 12:
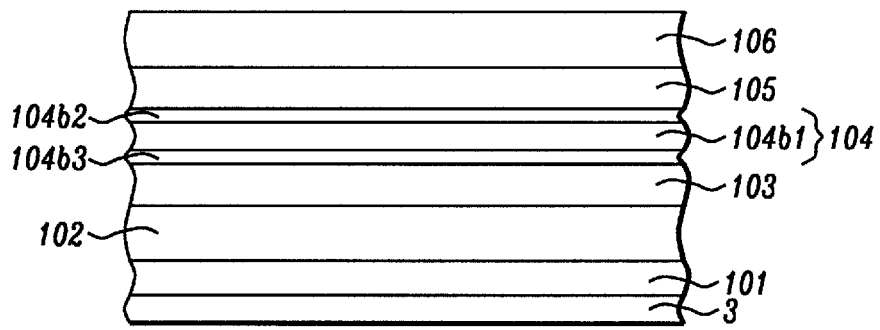

Referring to FIG. 12, the MR sensor stack in FIG. 11 is shown after an annealing step described earlier is performed wherein intermediate tunnel barrier 104i is transformed into a final tunnel barrier structure 104. In this case, oxygen from layer 104b diffuses into both MgN layers 104n, 104m to form a lower MgON layer 104b3 and an upper MgON layer 104b2 thereby generating a final tunnel barrier having a $MgO_{y3}N_{z3}/MgO_{y1}N_{z1}/MgO_{y2}N_{z2}$ configuration wherein the oxygen and nitrogen content in one or both of the upper and low magnesium oxynitride layers may differ from an oxygen and nitrogen content in middle $MgO_{y1}N_{z1}$ layer. In one aspect, the lower $MgO_{y3}N_{z3}$ layer and upper $MgO_{y2}N_{z2}$ layer have lower oxygen content and a lesser thickness than the middle $MgO_{y1}N_{z1}$ layer. Furthermore, there may be an oxygen gradient in $MgO_{y3}N_{z3}$ layer 104b3 and in $MgO_{y2}N_{z2}$ layer 104b2 such that oxygen content decreases with increasing distance from the $MgO_{y1}N_{z1}$ layer 104b1.

Figure 13:
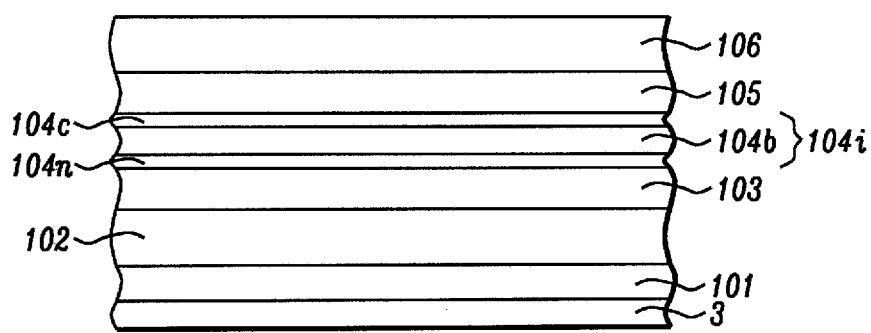
FIGS. 13-14 illustrate a sequence of steps for forming a $MgO_{y3}N_{z3}/MgO_{y1}N_{z1}/MgO$ tunnel barrier layer according to another embodiment of the present disclosure.

In FIG. 13, another embodiment is depicted wherein the second MgN layer in FIG. 11 is replaced by a Mg layer. Thus the intermediate tunnel barrier stack 104i has a MgN/MgON/Mg configuration represented by layers 104n/104b/104c in the drawing.

Figure 14:
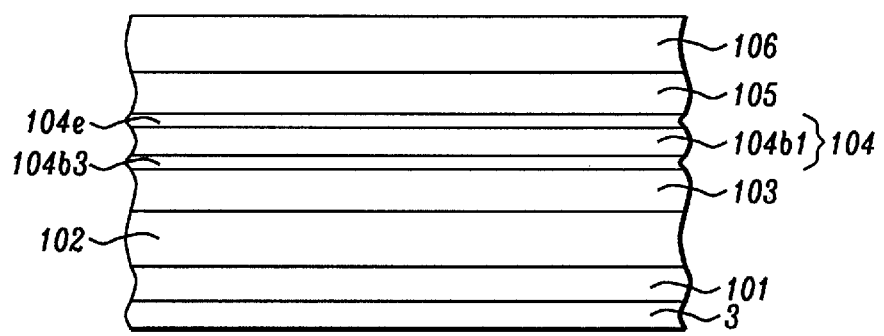

Referring to FIG. 14, the MR sensor stack is shown after an annealing step described earlier is performed wherein intermediate tunnel barrier 104i is transformed into a final tunnel barrier structure 104. Oxygen from layer 104b diffuses into the lower MgN layer 104n and into upper Mg layer 104c to form a final tunnel barrier having a $MgO_{y3}N_{z3}/MgO_{y1}N_{z1}/MgO$ configuration represented by stack 104b3/104b1/104e wherein the oxygen and nitrogen content in the $MgO_{y3}N_{z3}$ layer may have a different oxygen and nitrogen content than in the $MgO_{y1}N_{z1}$ layer. The lower $MgO_{y3}N_{z3}$ layer may have a lower oxygen content than the middle $MgO_{y1}N_{z1}$ layer. Preferably, MgN layer 104n is converted to MgON layer 104b3 without significant oxygen diffusion into the pinned layer, the Mg layer is converted to MgO without significant diffusion into the free layer, and a thickness for each layer 104b3, 104e is less than that of layer 104b1. The final tunnel barrier is comprised primarily of magnesium oxynitride. There may be an oxygen gradient in layers 104b3, 104e such that oxygen content in both layers decreases with increasing distance from the middle $MgO_{y1}N_1$ layer.

Figure 10:
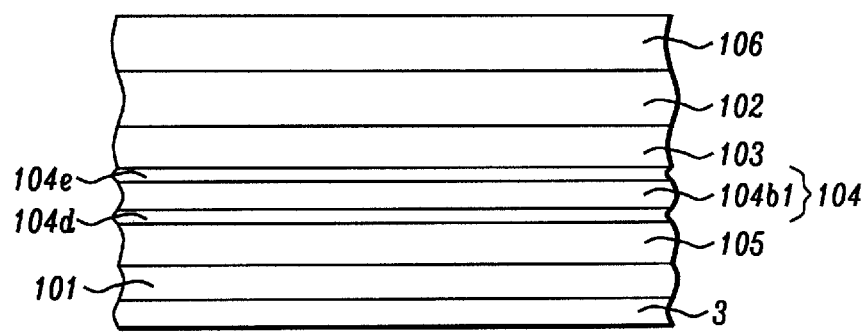
FIG. 10 shows a MgO/MgON/MgO tunnel barrier in a MR sensor with a top spin valve configuration according to an embodiment of the present disclosure.

It should be understood that in all of the aforementioned embodiments, the pinned layer and free layer may be switched to form a top spin valve MR sensor as found in FIG. 10, for example. The AFM layer 102 is also moved to a position between the pinned layer and capping layer in the top spin valve structures. Moreover, the $MgO_{y1}N_{z1}$ layer has a nitrogen content (z1) of at least 1 atomic %, and possibly greater than the maximum of 50 atomic % in the $MgO_yN_z$ layer, depending on the nitrogen content (z) and the extent of oxygen diffusion out of the $MgO_yN_z$ layer during the annealing process.

Subsequent processes that form sidewalls 107 on the MR sensor (FIG. 3) and adjoining hard bias layers 51 and insulation layers 50 with an overlying upper shield 7 are well known by those skilled in the art and are not described herein. Moreover, it is well known that a top surface (not shown) of the MR sensor may have a circular or elliptical shape from a top-down view along the z-axis. A plurality of MR sensors also known as MTJ nanopillars are typically arrayed in a design with columns and rows on the substrate before the substrate is sliced to form individual devices.

The present disclosure takes advantage of an intermediate $Mg/MgO_yN_z/Mg$, $Mg/MgO_yN_z/MgN$, $MgN/MgO_yN_z/MgN$, or $MgN/MgO_yN_z/Mg$ tunnel barrier stack followed by at least one annealing process to form a final tunnel barrier structure comprised primarily of magnesium oxynitride and having a $MgO/MgO_{y1}N_{z1}/MgO$, $MgO/MgO_{y1}N_{z1}/MgO_{y2}N_{z2}$, $MgO_{y3}N_{z3}/MgO_{y1}N_{z1}/MgO_{y2}N_{z2}$, or $MgO_{y3}N_{z3}/MgO_{y2}N_{z2}/MgO$ configuration wherein oxygen content in the middle $MgO_{y1}N_{z1}$ layer may differ from that in the $MgO_{y2}N_{z2}$ and $MgO_{y3}N_{z3}$ layers. In particular, oxygen diffusion from the middle $MgO_{y1}N_{z1}$ layer in the intermediate tunnel barrier during the annealing process may be controlled to prevent significant oxidation of an adjacent pinned layer and free layer thereby providing a MR ratio of at least 70% while enabling a RA product less than 1 ohm-μm². In one product, we achieved a RA=0.6 ohm-μm², dR/R=70%, and interlayer coupling of −180 Oe for a MTJ with a MgON tunnel barrier layer compared with RA=0.6 ohm-μm², dR/R=70% and interlayer coupling of −220 Oe for a MTJ with a MgO tunnel barrier. Moreover, pinhole density is reduced in a tunnel barrier comprised primarily of MgON compared with a MgO tunnel barrier.

While this disclosure has been particularly shown and described with reference to, the preferred embodiment thereof, it will be understood by those skilled in the art that various changes in form and details may be made without departing from the spirit and scope of this disclosure.

We claim:

1. A composite tunnel barrier formed between a first ferromagnetic layer and a second ferromagnetic layer in a magnetic tunnel junction (MTJ), the composite tunnel barrier has a metal oxide/metal oxynitride/metal oxide configuration wherein a thickness of each metal oxide layer is less than a thickness of the metal oxynitride layer such that the composite tunnel barrier layer is primarily metal oxynitride, and each metal oxide layer has an oxygen content less than that of the metal oxynitride layer.

2. The composite tunnel barrier layer of claim 1 wherein the metal is selected from Al, Ta, Zn, Ti, AlZn, AlTi, CoMg, ZnMg, Mg, and Sn.

3. The composite tunnel barrier of claim 1 wherein the MTJ has a bottom spin valve configuration wherein the first ferromagnetic layer is a pinned layer and the second ferromagnetic layer is a free layer.

4. The composite tunnel barrier of claim 1 wherein the MTJ has a top spin valve configuration wherein the first ferromagnetic layer is a free layer and the second ferromagnetic layer is a pinned layer.

5. A composite tunnel barrier formed between a first ferromagnetic layer and a second ferromagnetic layer in a magnetic tunnel junction (MTJ), the composite tunnel barrier has a metal oxide/first metal oxynitride/second metal oxynitride, third metal oxynitride/first metal oxynitride/second metal oxynitride, or third metal oxynitride/first metal oxynitride/metal oxide configuration wherein a thickness of the metal oxide, second metal oxynitride, and third metal oxynitride layers is less than a thickness of the first metal oxynitride layer such that the composite tunnel barrier layer is primarily metal oxynitride, and each of the metal oxide, second metal oxynitride, and third metal oxynitride layers has an oxygen content less than that of the first metal oxynitride layer.

6. The composite tunnel barrier layer of claim 5 wherein the metal is selected from Al, Ta, Zn, Ti, AlZn, AlTi, CoMg, ZnMg, Mg, and Sn.

7. The composite tunnel barrier of claim 5 wherein the MTJ has a bottom spin valve configuration wherein the first ferromagnetic layer is a pinned layer and the second ferromagnetic layer is a free layer.

8. The composite tunnel barrier of claim 5 wherein the MTJ has a top spin valve configuration wherein the first ferromagnetic layer is a free layer and the second ferromagnetic layer is a pinned layer.

9. A magnetoresistive (MR) sensor, comprising:
(a) a first ferromagnetic (FM1) layer formed on a substrate;
(b) a composite tunnel barrier layer having a $MgO/MgO_{y1}N_{z1}/MgO$, $MgO/MgO_{y1}N_{z1}/MgO_{y2}N_{z2}$, $MgO_{y3}N_{z3}/MgO_{y1}N_{z1}/MgO$ or $MgO_{y3}N_{z3}/MgO_{y1}N_{z1}/MgO_{y2}N_{z2}$ configuration comprised primarily of magnesium oxynitride wherein a bottom MgO or $MgO_{y3}N_{z3}$ layer contacts the first ferromagnetic layer and an uppermost MgO or $MgO_{y2}N_{z2}$ layer contacts an overlying second ferromagnetic (FM2) layer, y1, y2, y3 are an oxygen content and z1, z2, z3 are a nitrogen content in the magnesium oxynitride layers, y2 and y3 are each less than y1, and z1 is from 1 to at least 50 atomic %; and
(c) the FM2 layer.

10. The MR sensor of claim 9 wherein the $MgO_{y1}N_{z1}$ layer has a thickness from about 4 to 8 Angstroms.

11. The MR sensor of claim 9 wherein the MR sensor further comprises a seed layer, AFM layer, and a capping layer as the uppermost layer, the FM1 layer is a pinned layer, and the FM2 layer is a free layer to give a bottom spin valve configuration with a stack of layers represented by seed layer/AFM layer/pinned layer/composite tunnel barrier/free layer/capping layer.

12. The MR sensor of claim 9 wherein the MR sensor further comprises a seed layer, AFM layer, and a capping layer as the uppermost layer, the FM1 layer is a free layer, and the FM2 layer is a pinned layer to give a top spin valve configuration with a stack of layers represented by seed layer/free layer/composite tunnel barrier/pinned layer/AFM layer/capping layer.

13. The MR sensor of claim 9 wherein the oxygen content in the $MgO_{y3}N_{z3}$ layer and in the $MgO_{y2}N_{z2}$ layer decreases with increasing distance from the $MgO_{y1}N_{z1}$ layer.

14. The MR sensor of claim 9 wherein an oxygen content in the MgO layers decreases with increasing distance from the $MgO_{y1}N_{z1}$ layer.

15. The MR sensor of claim 9 wherein each of the MgO, $MgO_{y3}N_{z3}$, and $MgO_{y2}N_{z2}$ layers has a thickness less than that of the $MgO_{y1}N_{z1}$ layer.

* * * * *